(12) United States Patent
Molnar et al.

(10) Patent No.: US 8,308,490 B2
(45) Date of Patent: Nov. 13, 2012

(54) CONTACT CONFIGURATION FOR ELECTRONICS TO BASE CONNECTION

(75) Inventors: Nathan J. Molnar, Shaker Heights, OH (US); Douglas R. Bodmann, Shaker Heights, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 12/894,573

(22) Filed: Sep. 30, 2010

(65) Prior Publication Data

US 2012/0083165 A1    Apr. 5, 2012

(51) Int. Cl.
*H01R 12/00* (2006.01)
(52) U.S. Cl. .......................................... 439/61
(58) Field of Classification Search ............ 439/61, 439/644, 377
See application file for complete search history.

(56) References Cited

U.S. PATENT DOCUMENTS

| | | | |
|---|---|---|---|
| 2,154,301 A | 4/1939 | Clement | |
| 2,731,609 A * | 1/1956 | Sobel, III | 439/74 |
| 3,130,351 A * | 4/1964 | Giel | 361/759 |
| 3,432,795 A * | 3/1969 | Jayne | 439/60 |
| 3,576,515 A * | 4/1971 | Frantz | 439/267 |
| 3,603,915 A * | 9/1971 | Jayne et al. | 439/633 |
| 4,158,220 A * | 6/1979 | Yamamoto et al. | 361/796 |
| 4,834,665 A * | 5/1989 | Kreinberg et al. | 439/260 |
| 4,863,394 A | 9/1989 | Henshaw, Jr. | |
| 4,872,851 A | 10/1989 | Babuka et al. | |
| 4,999,787 A | 3/1991 | McNally et al. | |
| 5,205,753 A * | 4/1993 | Butterfield et al. | 439/157 |
| 5,336,094 A | 8/1994 | Johnson | |
| 5,584,030 A | 12/1996 | Husak et al. | |
| 6,027,379 A | 2/2000 | Hohorst | |
| 6,171,138 B1 | 1/2001 | Lefebvre et al. | |
| 6,447,309 B1 | 9/2002 | Ko et al. | |
| 6,860,766 B2 | 3/2005 | Aujla et al. | |
| 7,458,815 B2 * | 12/2008 | Fallah-Adl et al. | 439/61 |

* cited by examiner

*Primary Examiner* — Phuong Dinh
(74) *Attorney, Agent, or Firm* — Fay Sharpe LLP; R. Scott Speroff; John M. Miller

(57) ABSTRACT

An electronics circuit board includes a periphery defined by a plurality of edges. At least one power contact is located adjacent a first one of said edges and a plurality of data contacts are located adjacent a second one of said edges. The first and second edges are arranged transversely relative to each other. The circuit board is operatively installed on a base that includes a power connector and a data connector. At least one power contact of the circuit board is operably engaged with the power connector and the plurality of data contacts of the circuit board are operably engaged with said data connector. The power connector is located adjacent said first edge of the circuit board and the data connector is located adjacent a second edge of the circuit board.

5 Claims, 9 Drawing Sheets

CONTACT CONFIGURATION FOR ELECTRONICS TO BASE CONNECTION

BACKGROUND

A wide variety of electrical contacts for electronics modules are known. With respect to circuit boards that are operably connected to a base (such as a backplane, bus, etc.), the circuit board typically includes both power and data contacts located along a single edge of the circuit board that are adapted for mating with corresponding power and data connectors of the base. The circuit board is installed to the base by relative sliding movement between the circuit board and the base power and data connectors (typically by movement of the circuit board relative to the base) along an insertion axis that lies in the plane of the circuit board, with the edge of the circuit board including the power and data contacts being the leading edge in terms of the insertion direction. When the power and data contacts of the circuit board are operatively connected with the respective power and data connectors of the base, both the power and data connectors of the base are located adjacent the circuit board leading edge.

Such an approach for locating the circuit board power and data contacts along a single, common edge of a circuit board has been deemed suboptimal for a variety of reasons. For example, including both the power and data contacts on the single leading edge of the circuit board is challenging due to the space required for each and the limited space available on the leading edge of the circuit board. Also, regulations or design practices often specify a minimum required space between power and data contacts on the circuit board, and this makes it even more difficult to locate both power and data contacts on the leading edge.

Another issue that must be considered in locating the power and data contacts on a circuit board is the need to provide a contact system that enables removal and insertion under power (RIUP), where the circuit board or other electronic device is installed in or removed from a base while the backplane or other circuit of the base is actively transmitting data and also usually an operating voltage. Ideally, data continuity is maintained perfectly in the backplane circuit during the insertion and/or removal process. The known contact placements with both power and data contacts located on the leading insertion edge of the circuit board enable RIUP operations, and any viable alternative contact placement system must also be able to enable RIUP operations in order to be commercially viable.

FIG. 1 is schematic view of a conventional circuit board B' as described above. The circuit board B' includes one or more electronic components or circuits EL installed thereon or otherwise connected thereto, for example analog and/or digital input/output (I/O) electronics for an industrial automation I/O module. The illustrated circuit board B' is rectangular and includes four edges E1,E2,E3,E4 that define its periphery P. Inner edge E1 is the leading edge in terms of the insertion direction ID along which the circuit board B' is installed into a mating base X'. The base X' is a complete backplane, housing, or like structure or a component same. The insertion direction ID extends parallel to an insertion axis IX that lies in the plane of the circuit board B'. The insertion axis IX is perpendicular to the inner edge E1. Outer edge E2 is spaced-apart from and arranged parallel to the leading edge E1, and first and second lateral edges E3,E4 are spaced apart and parallel relative to each other and extend between and interconnect the inner (leading) and outer edges E1,E2.

The base X' includes power and data connectors PX' and DX' that are respectively connected to backplane/bus power and data circuits BX' in the base X'. The circuit board B' includes one or more power contacts PC' and a plurality of data contacts DC', and both the power and data contacts PC',DC' are located adjacent the inner edge E1 of the circuit board B' and are located adjacent each other. The power and data contacts PC',DC' are adapted to mate respectively with the power and data connectors PX',DX' of the base X'. In particular, the power and data contacts PC',DC' of the circuit board B' are operatively connected to the base power and data connectors PX',DX' via relative movement between the circuit board B' and base X' in the insertion direction ID (typically by movement of the circuit board B' relative to the base X), and the power and data contacts PC',DC' of the circuit board B' are operatively disconnected from the base power and data connectors PX',DX' with relative movement between the circuit board B' and base X' in the direction opposite the insertion direction ID. Field contacts/connectors F are located adjacent the outer edge E2 and/or one of the lateral edges E3,E4 and are adapted to be connected to field devices (e.g., sensors, switches, indicator lights, etc.) through a terminal base or removable terminal block (RTB) or otherwise.

SUMMARY

In accordance with one aspect of the present development, an electronics circuit board includes a periphery defined by a plurality of edges. At least one power contact is located adjacent a first one of said edges and a plurality of data contacts are located adjacent a second one of said edges. The first and second edges are arranged transversely relative to each other.

In accordance with another aspect of the present development, an electronics assembly comprises a circuit board including a periphery defined by a plurality of edges. At least one power contact is located adjacent a first one of said edges and a plurality of data contacts are located adjacent a second one of said edges. The first and second edges are arranged transversely relative to each other. The electronics assembly further includes a base on which said circuit board is operatively installed. The base includes a power connector and a data connector. At least one power contact of the circuit board is operably engaged with the power connector and the plurality of data contacts of the circuit board are operably engaged with said data connector.

In accordance with a further aspect of the present development, an electronics assembly includes a circuit board comprising a periphery defined by a plurality of edges, at least one power contact located adjacent a first one of said edges, and at least one data contact located adjacent a second one of said edges. The first and second edges are arranged transversely relative to each other. The assembly further includes a base on which said circuit board is operatively installed. The base includes a power connection point and a data connection point, wherein the power contacts of said circuit board are operably engaged with the power connection point and the data contacts are operably engaged with the data connection point. The data connection point is selectively arranged in an opened configuration for insertion and removal of the circuit board relative to said base, and the data connection point is selectively configured in a closed configuration for operative electrical connection between the data connection point and the data contacts.

DETAILED DESCRIPTION

Figure 1:
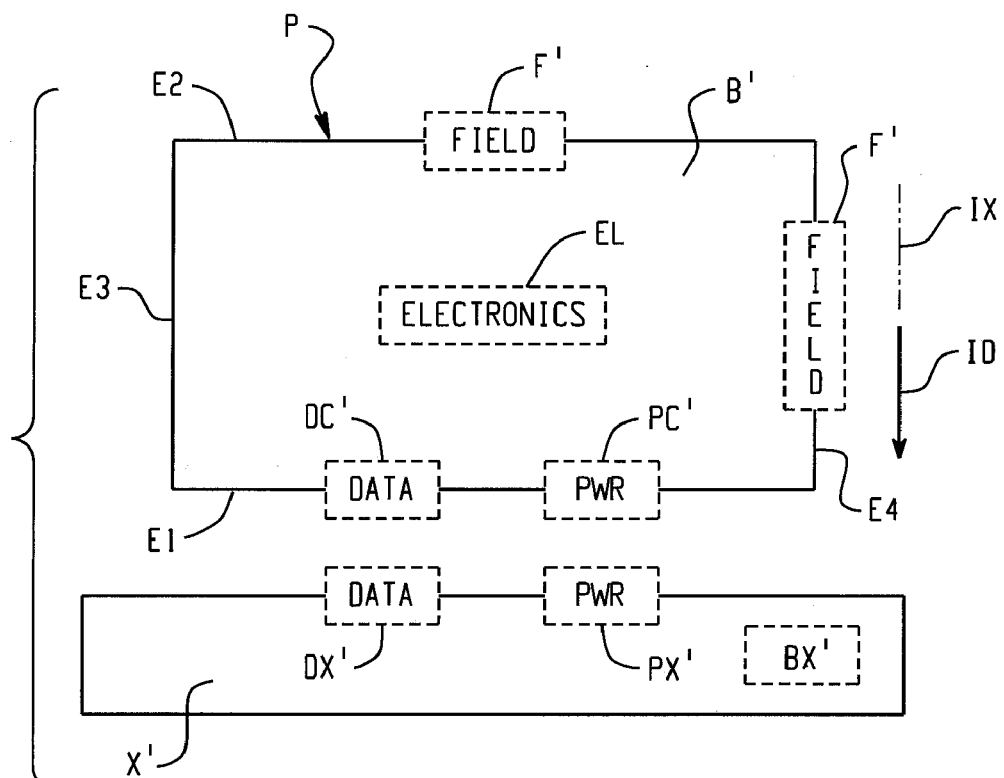
FIG. 1 is schematic view of a conventional circuit board including both its power and data contacts located adjacent a single common edge.
Figure 2:
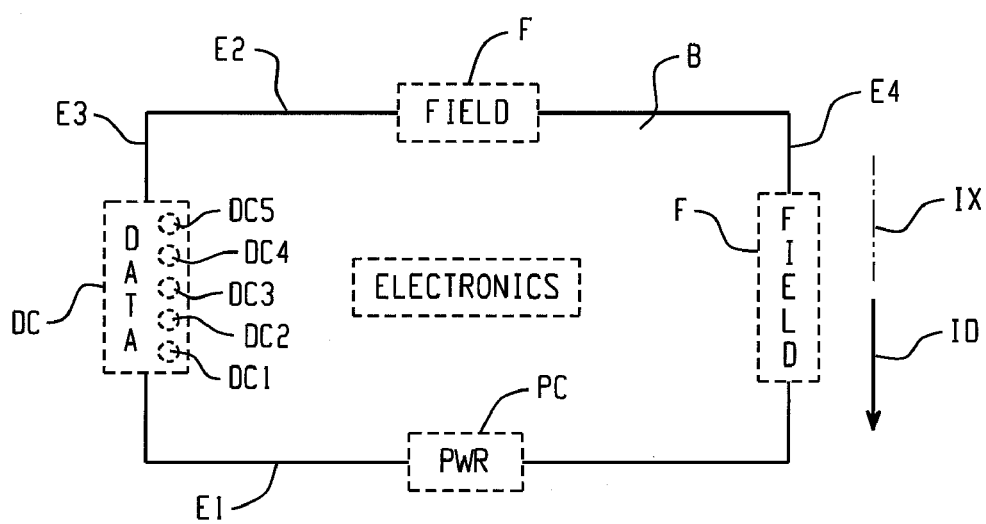
FIG. 2 is similar to FIG. 1 but shows a contact configuration in accordance with the present development, where the power and data contacts are located on separate, edges of the circuit board that are arranged transversely relative to each other.

FIG. 2 is similar to FIG. 1 but shows a circuit board B including a power and data contact configuration in accordance with the present development, wherein the power contacts PC and data contacts DC of the circuit board B are located adjacent separate peripheral edges of the circuit board that are oriented transversely relative to each other. In particular, FIG. 2 is schematic view of the circuit board B, which includes one or more electronic components or circuits EL installed thereon or otherwise connected thereto, for example analog and/or digital input/output (I/O) electronics for an industrial automation I/O module. The illustrated circuit board B is rectangular and includes four edges E1,E2,E3,E4 that define its periphery P. The inner edge E1 is the leading edge in terms of the insertion direction ID along which the circuit board B is installed into a mating base, the outer edge E2 is spaced-apart from and arranged parallel to the inner edge E1, and the first and second opposite lateral edges E3,E4 are spaced apart and arranged parallel relative to each other and extend between and interconnect the inner (leading) and outer edges E1,E2. The insertion axis IX is perpendicular to the inner edge E1.

Figure 3A:
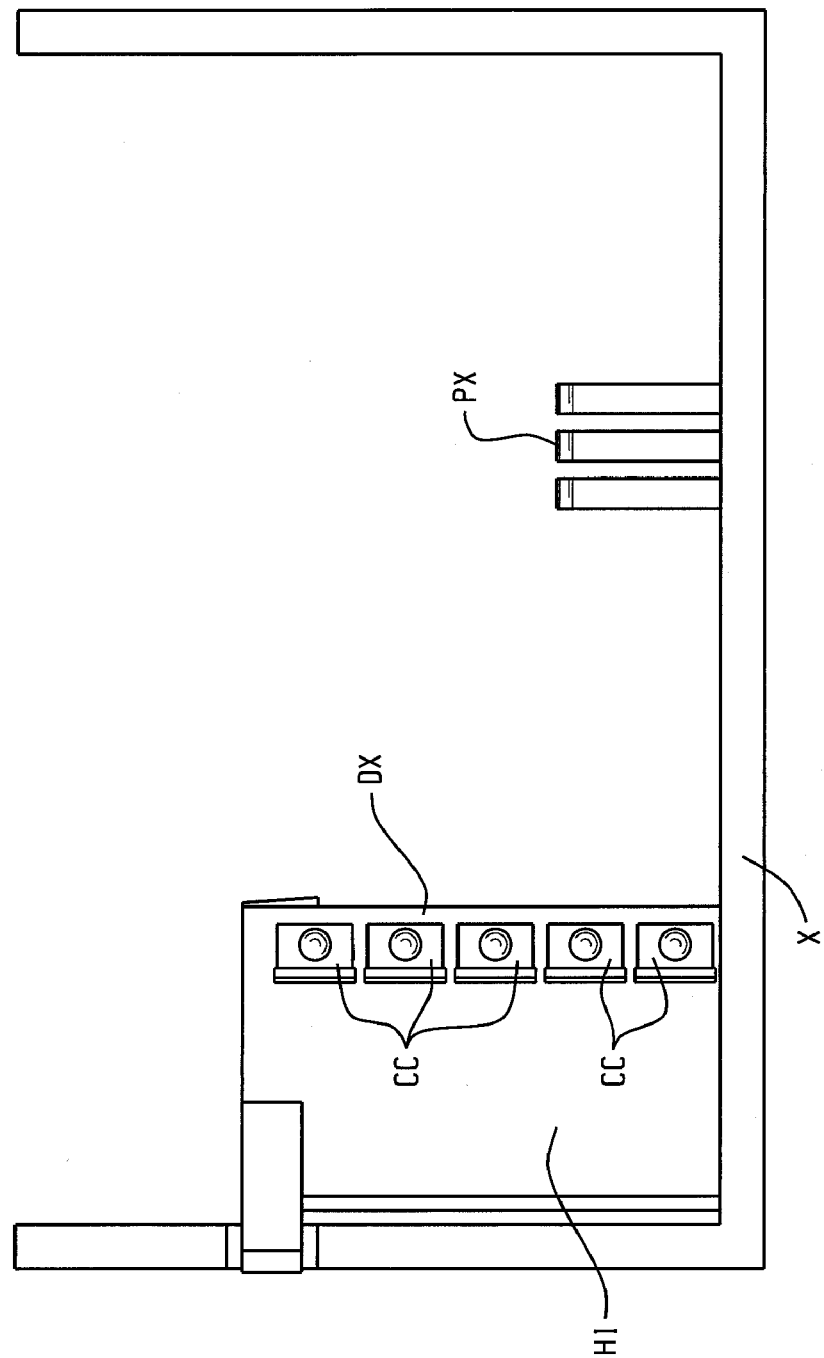
FIG. 3A shows an example of a base conformed in accordance with the present development and adapted to be operatively connected with a circuit board formed in accordance with the present development.
Figure 3B:
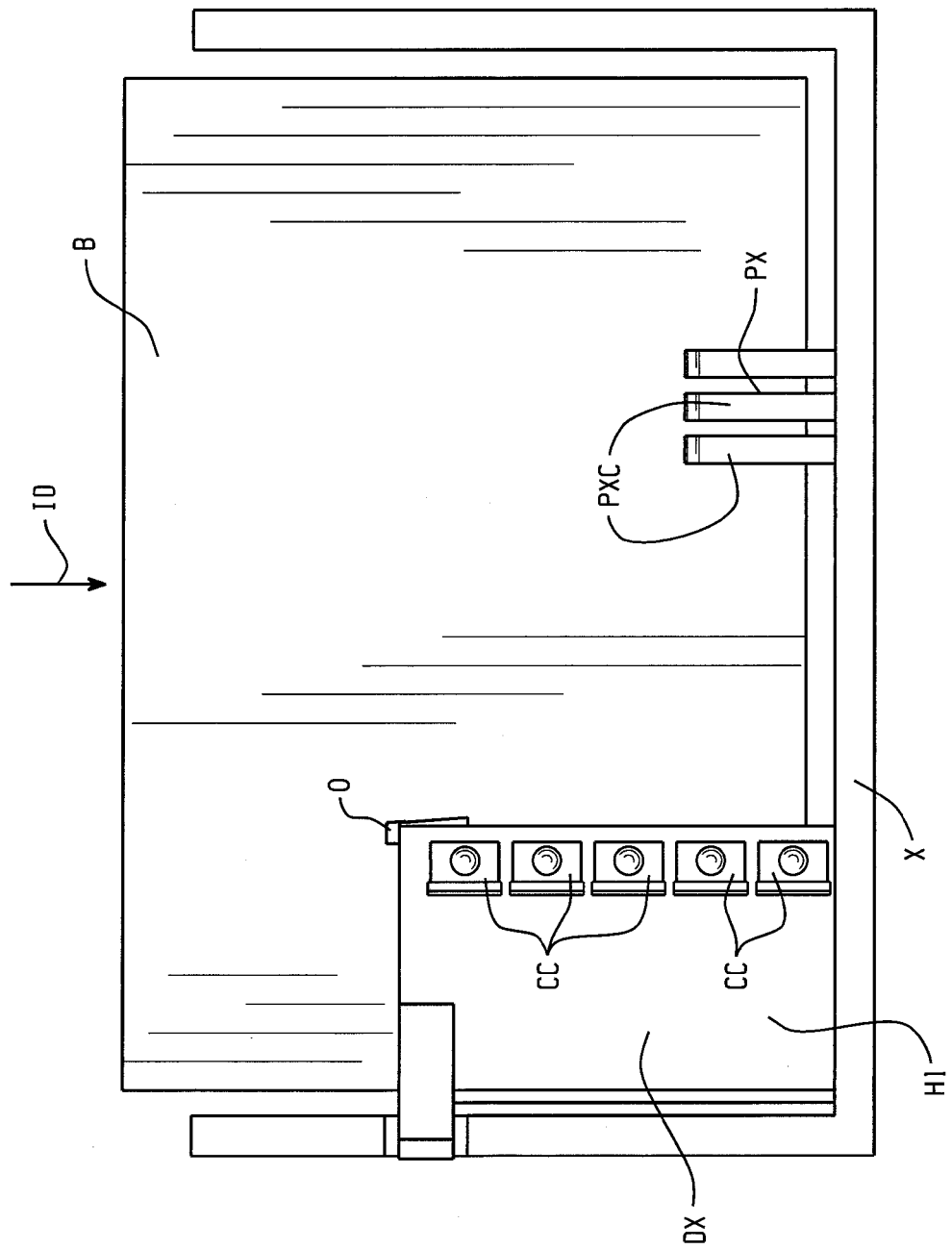
FIGS. 3B and 3C shows the base of FIG. 3A including a circuit board formed in accordance with the present development (e.g., the circuit board of FIG. 2) operatively connected thereto.
Figure 3C:
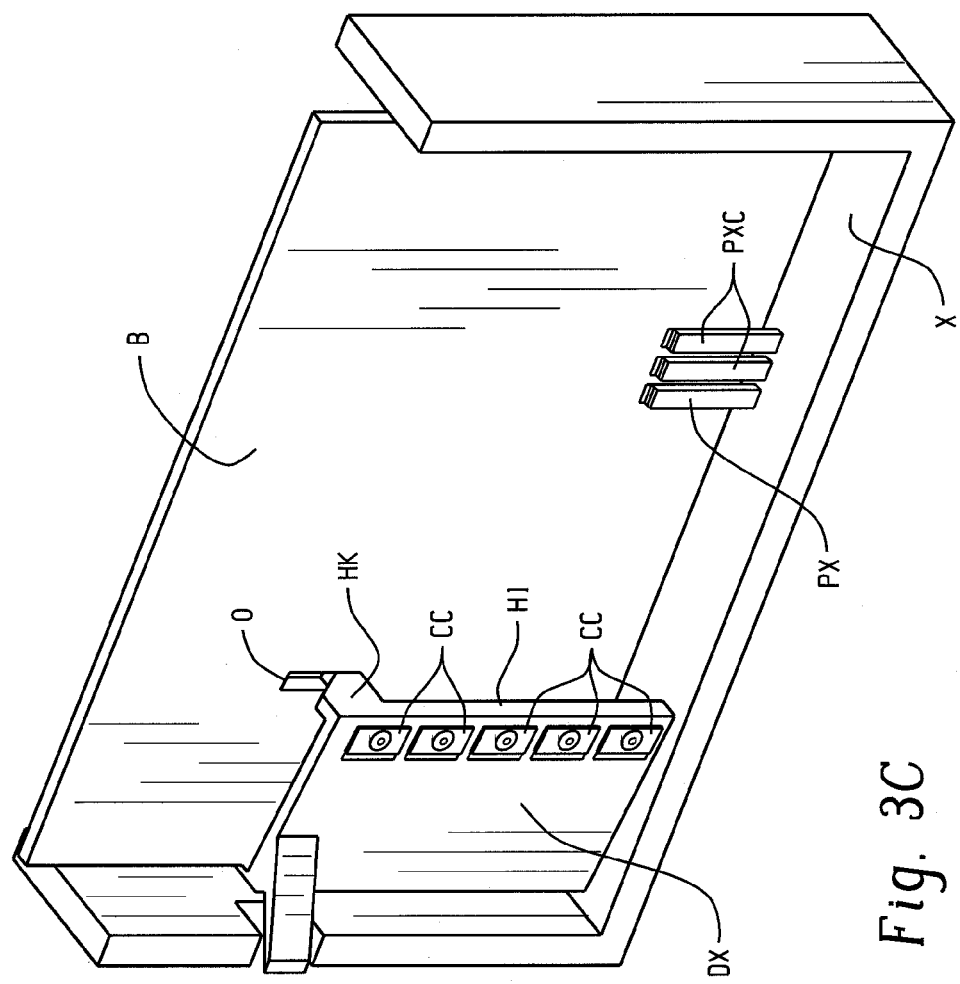

The base X with which the circuit board B is adapted to be selectively operatively engaged is shown separately in FIGS. 3A, and FIGS. 3B and 3C show the circuit board B operatively connected with/installed to the base X. The base X can be a complete backplane, bus, housing or the like, or can be a component of same. The base X includes power and data connectors or connections/connection points PX and DX that are respectively connected to backplane/bus power and data circuits BX in the base X. The combination of the circuit board B installed to the base X provides an electronics assembly.

The circuit board B includes one or more power contacts PC and at least one or typically a plurality of data contacts DC that are adapted for respectively operatively mating with the power and data connectors PX,DX of the base X. The power and data connectors PX,DX of the base are located and adapted to operatively engage the power and data contacts PC,DC of the circuit board B when the circuit board is operatively installed to the base as shown in FIGS. 3B and 3C. Unlike the circuit board B', the power and data contacts PC,DC of the board B are located adjacent separate peripheral edges of the circuit board B that are transversely oriented relative to each other. In the illustrated embodiment, the one or more power contacts PC are located adjacent the inner (leading) edge E1, and the data contacts DC are located adjacent at least one of the lateral edges E3, E4 (the lateral edge E3 as shown in FIG. 2). The power and data connectors/connection points PX,DX can be provided by or included in a single connector as long as the single connector is configured to make the required electrical power and data connections with the power and data contacts PC,DC of the circuit board B.

The power and data contacts PC,DC of the circuit board B are operatively connected to the base power and data connectors PX,DX via relative movement between the circuit board B and base X in the insertion direction ID (typically by movement of the circuit board B relative to the base X), and the power and data contacts PC,DC of the circuit board B are operatively disconnected from the base power and data connectors PX,DX with relative movement between the circuit board B and base X in the direction opposite the insertion direction ID. The insertion direction ID extends parallel to an insertion axis IX that lies in the plane of the circuit board B. With respect to the data contacts DC, it should be noted that multiple data contacts are provided (e.g., five contacts DC1, DC2,DC3,DC4,DC5 or some other number), and at least some of these are located different distances from the inner (leading) edge E1 as compared to each other, which requires that the corresponding data connector DX of the base X be located adjacent the lateral edge E3 of the circuit board B instead of adjacent the inner (leading) edge E1 when the circuit board B is fully operatively mated with the base X.

It should be noted that the power contacts PC and data contacts DC of the circuit board B are typically defined as a pair of contact patches, with the constituent contact patches of each pair located respectively adjacent first and second opposite faces BF1,BF2 (see FIG. 3E) of the circuit board B. As such, the term contact as used herein is intended to mean one or more contact patches.

Field contacts/connectors F are located adjacent the outer edge E2 and/or adjacent the lateral edge E4 opposite the data contacts DC. These field connectors F are adapted to be connected to field devices (e.g., sensors, switches, indicator lights, etc.) through a terminal base or removable terminal block (RTB) or otherwise.

The power and data connectors PX,DX of the base X are located such that they will lie respectively adjacent the inner edge E1 and the lateral edge of the circuit board that includes the data contacts DC (lateral edge E3 in the illustrated example) when the circuit board B is installed to the base X. As shown in FIG. 3B, the power connector PX engages the power contacts PC of the board B by linear sliding movement of the board B in the insertion direction ID. It is preferable that the data connector DX be configured to selectively provide: (i) an opened position for sliding insertion of the circuit board B relative thereto in the insertion direction ID (or removal of the circuit board in the opposite direction), where the connector contacts CC of the data connector DX are spaced from the circuit board data contacts DC1-DC5; (ii) an operative position where connector contacts CC of the data connector DX operatively engage respective data contacts DC1-DC5 of the circuit board B; and (iii) an closed position in which data signals are passed through the data connector DX via engaged pairs of connector contacts CC. The ability to place the data connector DX in the opened position facilitates insertion and removal of the board B relative to the base X, which reduces wear on the data connector DX and the data contacts DC, and which prevents or at least minimizes the data contacts DC1-DC5 being swiped across all contacts CC of the data connector during insertion and removal of the circuit board B (which can also limits undesired intermittent or transient data connections during the board insertion and removal process).

Figure 3D:
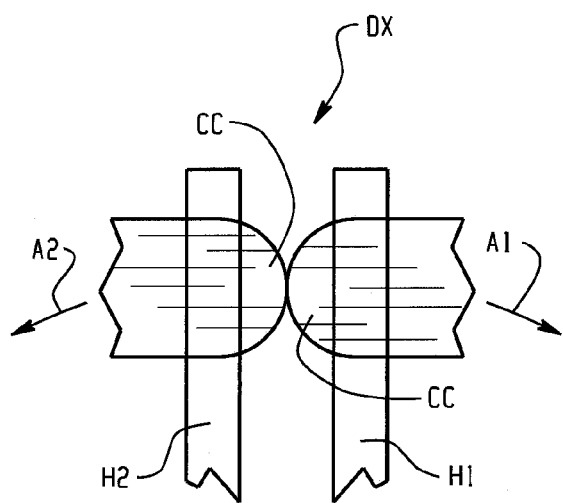
FIGS. 3D and 3E are partial top views of a data connector portion of a base formed in accordance with the present development.
Figure 3E:
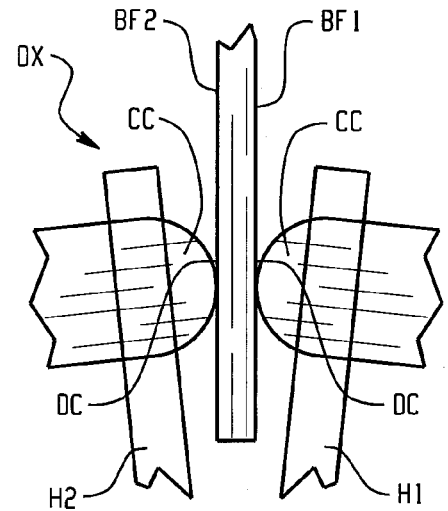

A to partial view of the base data connector DX is shown in FIGS. 3D in its closed position (with no circuit board B installed). FIG. 3E is similar but shows the base data connector DX in its operative position with a circuit board B installed. It can be seen that the data connector DX includes first and second contact holders H1,H2 (only the contact holder H1 is visible in FIGS. 3A-3C) that each include a plurality of connector contacts CC. When the data connector DX (and each contact holder H1,H2 thereof) is closed (FIG. 3D), each pair of aligned connector contacts CC of the first and second contact holders H1,H2 engage each other so that data signals pass through the data connector DX. The contact holders H1,H2 can be selectively manually spread apart as indicated by the arrows A1,A2 to move them to an opened position for insertion and removal of the circuit board B.

FIG. 3E shows the data connector DX and the contact holders H1,H2 thereof in the operative position where the connector contacts CC of the contact holders H1,H2 operatively engage a data contact DC of the installed circuit board B, i.e., the constituent parts of the data contact DC located respectively adjacent the board faces BF1,BF2. With brief reference again to FIGS. 3B and 3C, it is preferred that the circuit board B include a locator opening or recess O defined therein, and that at least one of the contact holders H1 include a key portion HK (not shown in FIG. 3D) that is received in the locator recess/opening O when the circuit board B is fully installed relative to the base X and when the data connector DX is positioned in its operative position. The recess or opening O can extend fully or only partially through the circuit board B. During insertion of the circuit board B, the key HK engages the circuit board and keeps the contact holder H1 in its opened position until the circuit board B is fully installed, at which time the key HK is received in the locator opening O which allows the contact holder H1 to move to its operative position. The data connector DX is configured such that it is normally resilient biased toward its closed position, and the contact holders H1,H2 thereof are selectively resiliently spread apart to the opened position when the key HK of each contact holder H1,H2 is abutted by the leading edge E1 of a circuit board B moving in the install direction ID as it is being installed to the base X, and/or the data connector DX is manually moved to its opened position prior to installation of the circuit board B. Also, to remove the circuit board, the data connector DX is manually moved to its opened position such that the key HK is disengaged from the recess O. In another alternative embodiment, the contact holders H1,H2 are biased toward the opened position so as to be normally opened, and a housing or cover (not shown) is installed over the circuit board B/base X assembly to force the contact holders to their closed positions. In these alternative embodiments, the contact holders H1,H2 can be fixed in position and the connector contacts CC thereof can move between the opened and closed positions relative to the contact holders.

Figure 3F:
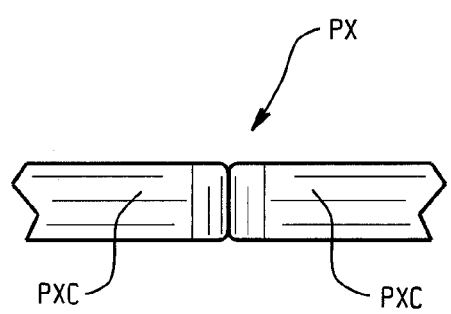
FIGS. 3F and 3G are partial top views of a power connector portion of a base formed in accordance with the present development.
Figure 3G:
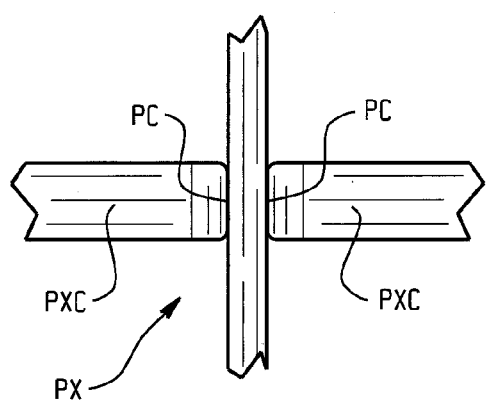

FIG. 3F shows the power connector PX of the base in its closed position (with no circuit board B installed) in which first and second power contacts PXC thereof are engaged with each other to pass power through the power connector PX. FIG. 3G shows the power connector in its operative position, wherein the power contacts PXC are engaged with the circuit board power contacts PC to provide power to the circuit board. The power contacts PXC are configured such that they are normally resiliently biased to the closed position, and they are resiliently spread apart to the operative position when abutted by the leading edge E1 of a circuit board B moving in the install direction ID as it is being installed to the base X. Those of ordinary skill in the art will recognize that the power and data connectors PX,DX of the base X enable RIUP capabilities for the circuit board B. The positions of the data contacts DC and the power contacts PC of the circuit board B relative to the data contacts DXC and power contacts PXC of the base connectors DX,PX is altered to control the make/break sequence by which the electrical data and power connections are made and broken.

Figure 4:
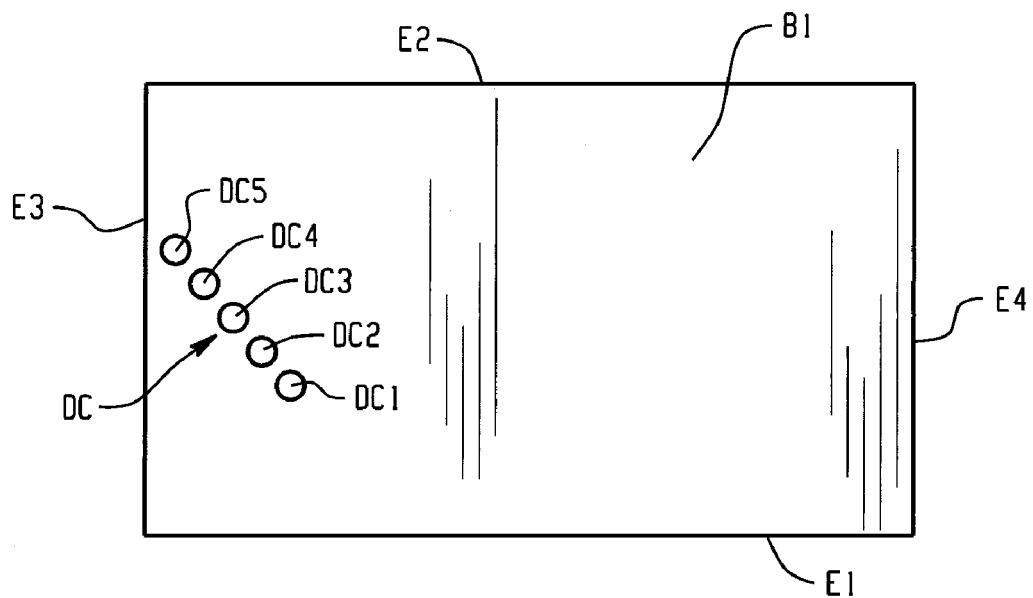
FIGS. 4 and 5 show respective alternative embodiments of a circuit board formed in accordance with the present development, wherein the data contacts located adjacent a lateral edge of the circuit board are staggered to control contact order, to prevent undesired transient/intermittent contacts, and to limit contact wear.
Figure 5:
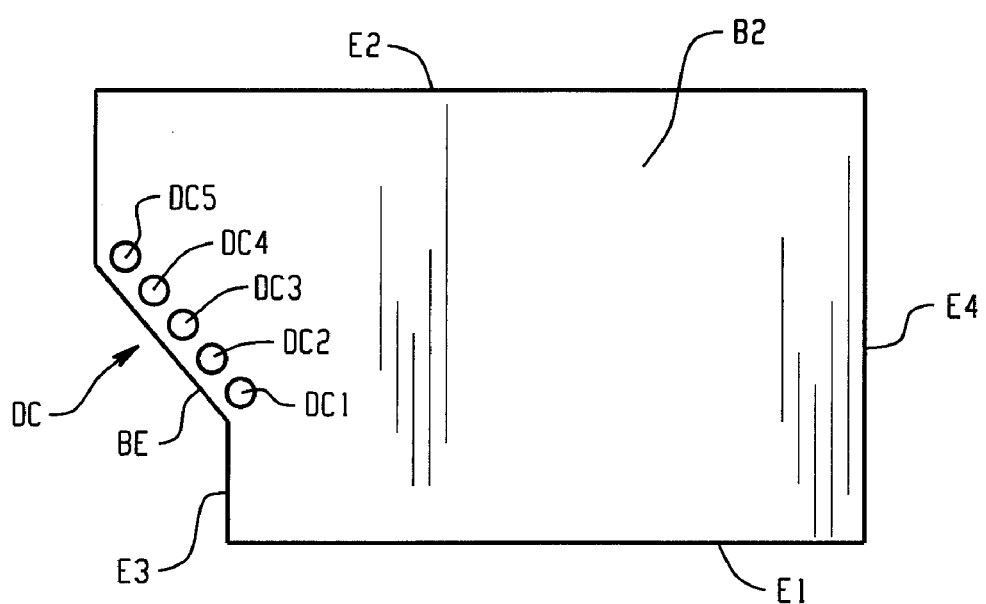

The circuit board B and/or the data contacts DC1-DC5 thereof is optionally specially configured to mate with the base data connector DX. FIG. 4 shows a first alternative embodiment of the circuit board B1, wherein the data contacts DC1-DC5 are staggered such that each data contact DC1-DC5 is located a different distance from the lateral edge E3 of the circuit board B. In this embodiment, the connector contacts CC of the base data connector DX are correspondingly staggered so that the connector contacts do not wipe over all of the data contacts DC1-DC5 during board installation but, instead, engage only a corresponding one of the data contacts DC1-DC5 when the board is installed. The embodiment B2 of FIG. 5 is similar, but the lateral edge E3 of the circuit board B also includes a beveled or angled portion BE that is angled with respect to the first (leading) edge E1 so as to correspond with the staggered arrangement of the data contacts DC1-DC5 such that the connector contacts CC of the base data connector DX do not need to wipe across the circuit board during install or removal of the circuit board. In this case, the data contacts DC1-DC5 extend adjacent the beveled edge portion BE so that they are staggered with respect to the insertion axis IX that extends perpendicularly with respect to the first edge E1.

Figure 6:
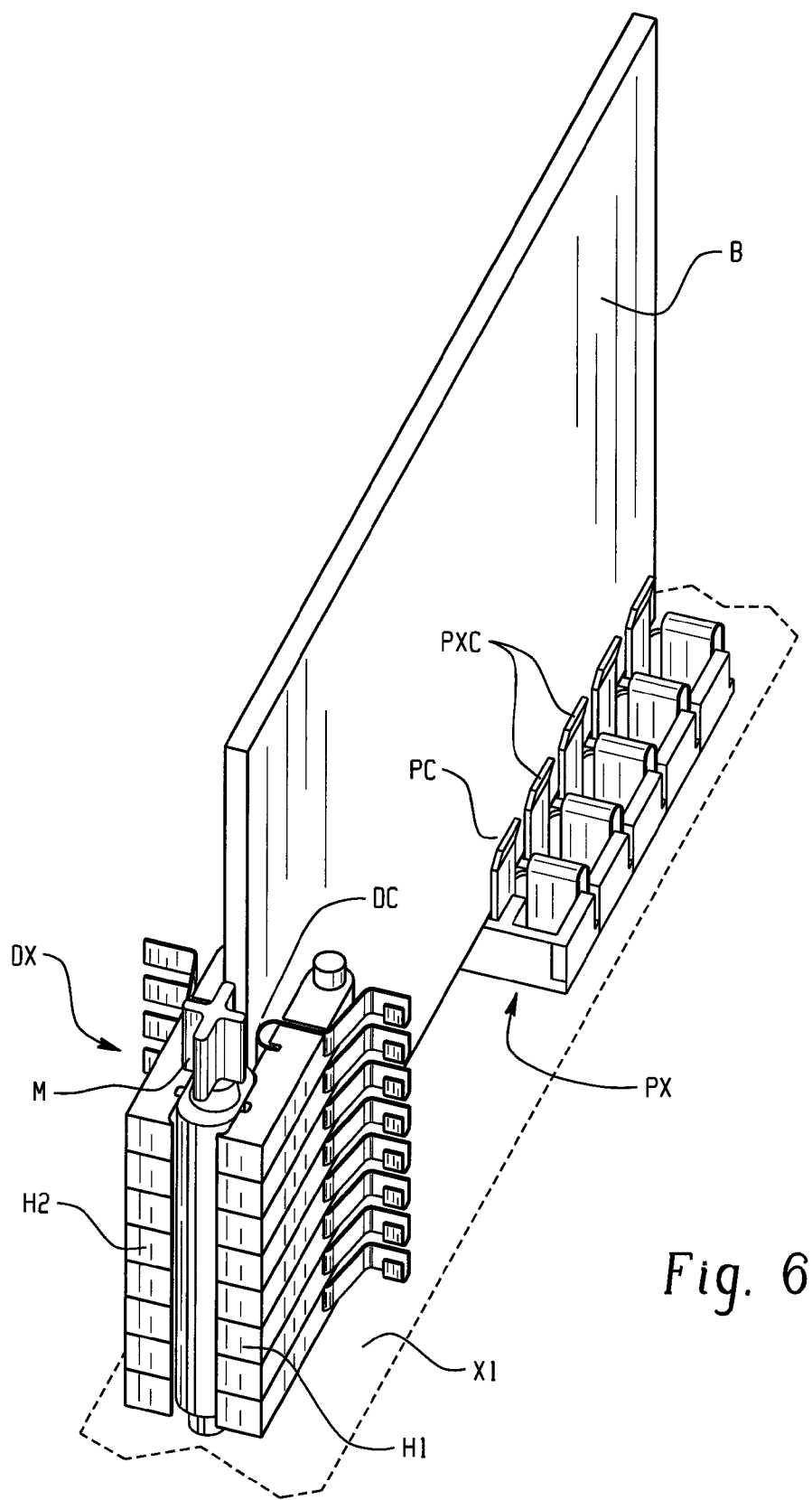
FIGS. 6 and 7 illustrate respective alternative embodiments of bases conformed in accordance with the present development and adapted to be operatively connected with a circuit board formed in accordance with the present development; and, FIGS. 8A and 8B show a circuit board formed in accordance with the present development installed in first and second different environments by rotation of the circuit board.
Figure 7:
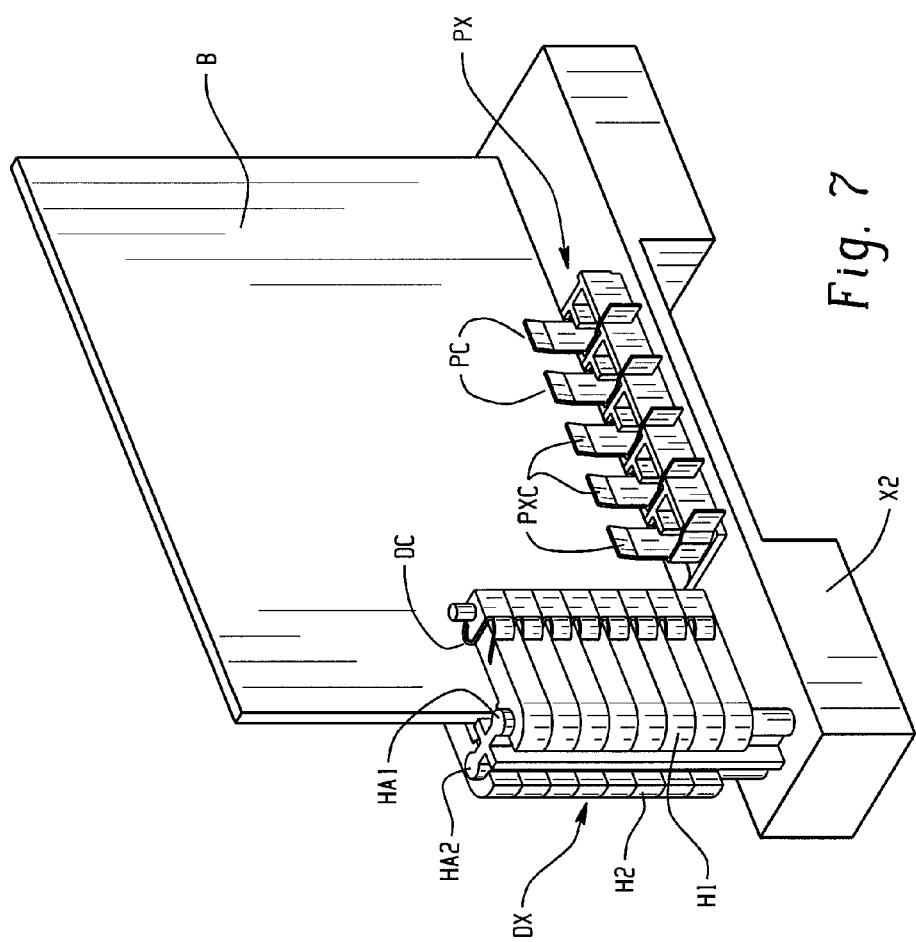

FIGS. 6 and 7 illustrate respective alternative embodiments of bases conformed in accordance with the present development and adapted to be operatively connected with a circuit board B formed in accordance with the present development. FIG. 6 shows a base X1 that is similar to the base X, except that the data connector DX includes a rotatable cam M. The first and second contact holders H1,H2 are biased toward their closed positions. Manual rotation of the cam M causes the first and second contact holders H1,H2 to move from the operative position (as shown) or the closed position (when the circuit board B is absent) to the opened position where the contact holders H1,H2 spread apart for insertion and removal of the board B. Further (or opposite) rotation of the cam M allows the contact holders to return resiliently to the closed position (or operative position if a circuit board B is present).

FIG. 7 shows a base X2 that is similar to the base X1, except that the first and second contact holders H1,H2 are rotatably supported on respective first and second axles HA1, HA2 that can be provided as part of the same one-piece axle structure as shown. The contact holders H1,H2 are each biased toward the closed position and each contact holder is manually movable from the closed or operative position (as shown in FIG. 7) to the opened position for insertion and removal of the circuit board B. Release of the manual opening force from the contact holders H1,H2 causes them to return resiliently to their closed or operative positions.

Figure 8A:
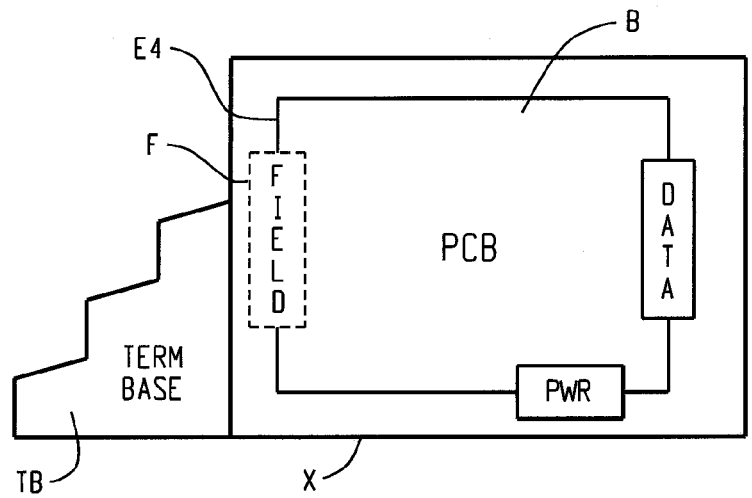
Figure 8B:
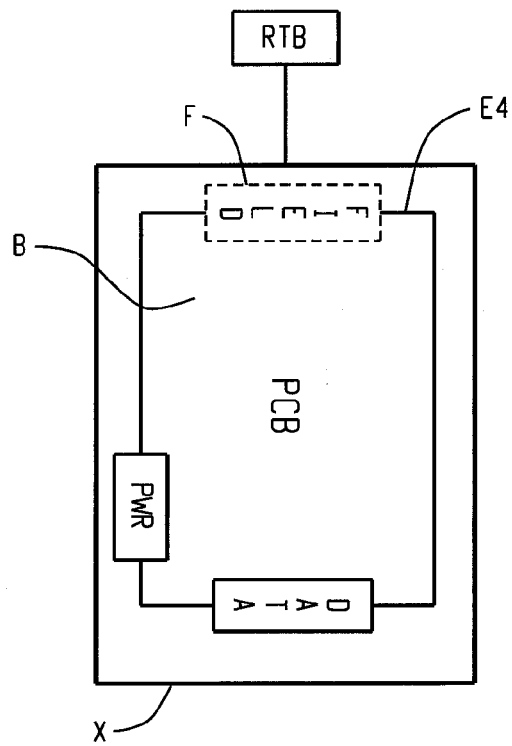

FIGS. 8A and 8B shows that a circuit board B configured in accordance with the present development is able to be installed in first and second different environments. FIG. 8A shows that the base X comprises a fixed base I/O module and that the field connectors F adjacent the edge E4 of the circuit board are positioned to mate with the terminal base TB. FIG. 8B shows the same circuit board B rotated 90 degrees and installed in a base X that comprises a chassis-mounted I/O module, wherein the field connectors F adjacent the edge E4 are located so as to be adapted for being engaged by a removable terminal block RTB. This universal installation in either the base X of FIG. 8A or the base X of FIG. 8B is not possible with the conventional circuit board of FIG. 1.

The development has been described with reference to preferred embodiments. Those of ordinary skill in the art will recognize that modifications and alterations to the preferred embodiments are possible. The disclosed preferred embodiments are not intended to limit the scope of the following claims, which are to be construed as broadly as possible, whether literally or according to the doctrine of equivalents.

The invention claimed is:
1. An electronics circuit board engaged with a base, said circuit board comprising:
   a periphery defined by a plurality of edges;
   at least one power contact located adjacent a first one of said edges;
   a plurality of data contacts located adjacent a second one of said edges, wherein said first and second edges are arranged transverse relative to each other;
   wherein said base comprises a power connector and a data connector, wherein said circuit board is installed in said base such that:
   said at least one power contact is operably engaged with said power connector; and,
   said plurality of data contacts are operably engaged with said data connector;
   the data connector selectively movable to and between opened and closed positions for insertion and removal of said circuit board relative to said base, wherein connector contacts of said data connector are spaced from said plurality of circuit board data contacts when said data connector is arranged in its opened position, and wherein said connector contacts of said data connector are engaged with said plurality of circuit board data contacts when said data connector is arranged in its closed position;
   said circuit board comprising at least one locator recess defined therein and said data connector comprising a key that abuts said circuit board and prevents said data connector from moving from its opened position to its closed position unless said circuit board is fully installed on said base and said key is received in said locator recess.

2. The electronics circuit board as set forth in claim 1, wherein said data connector comprises first and second movable contact holders located on opposite sides of said circuit board, and further comprises a manually movable cam engaged with said first and second contact holders, wherein said cam is selectively manually movable to move said first and second contact holders toward and away from said circuit board in order to move said data connector between said closed position and said opened position.

3. An electronics assembly comprising:
   a circuit board comprising a periphery defined by a plurality of edges,
   at least one power contact located adjacent a first one of said edges, and a plurality of data contacts located adjacent a second one of said edges, wherein said first and second edges are arranged transverse to each other;
   said plurality of data contacts: (i) each spaced a different distance from said first edge of said circuit board as compared to each other; and (ii) each spaced a different distance from said second edge of said circuit board as compared to each other so as to be staggered with respect to both said first and second edges of said circuit board; and,
   a base on which said circuit board is operatively installed, said base comprising a power connection point and a data connection point, wherein said at least one power contact of said circuit board is operably engaged with said power connection point and said plurality of data contacts are operably engaged with said data connection point, said data connection point comprising a plurality of data connector contacts that are staggered relative to each other in a manner that corresponds with said staggered spacing of said plurality of data contacts of said circuit board.

4. The electronics assembly as set forth in claim 3, wherein:
   said circuit board comprises at least one locator recess defined therein;
   said data connector of said base comprises first and second contact holders;
   said circuit board is located between and abutted by said first and second contact holders; and,
   a key is connected to at least one of said first and second contact holders, wherein said key blocks movement of at least one of said first and second contact holders from an opened position to a closed position unless said key is received in said locator recess of said circuit board when said circuit board is fully installed to said base.

5. An electronics assembly comprising:
   a circuit board comprising a periphery defined by a plurality of edges, at least one power contact located adjacent a first one of said edges, and at least one data contact located adjacent a second one of said edges, wherein said first and second edges are arranged transverse to each other; and,
   a base on which said circuit board is operatively installed, said base comprising a power connection point and a data connection point, wherein said at least one power contact of said circuit board is operably engaged with said power connection point and said at least one data contact is operably engaged with said data connection point;
   wherein said data connection point is selectively arranged in an opened configuration for insertion and removal of said circuit board relative to said base, and said data connection point is selectively configured in a closed configuration for operative electrical connection between said data connection point and said at least one data contact;
   wherein said data connection point comprises a key that projects therefrom and that blocks movement of said data connection point from its opened position to its closed position until said key is received in a locator recess defined in said circuit board.

* * * * *